United States Patent [19]
Greenhalgh

[11] Patent Number: 5,488,666
[45] Date of Patent: Jan. 30, 1996

[54] SYSTEM FOR SUPPRESSING SOUND FROM A FLAME

[75] Inventor: William H. Greenhalgh, Neshanic Station, N.J.

[73] Assignee: Greenhalgh Technologies, Neshanic Station, N.J.

[21] Appl. No.: 113,715

[22] Filed: Oct. 1, 1993

[51] Int. Cl.$^6$ .................................................... A61F 11/06
[52] U.S. Cl. .............................................. 381/71; 381/167
[58] Field of Search ................................. 381/167, 71, 94

[56] References Cited

U.S. PATENT DOCUMENTS

| | | |
|---|---|---|
| 1,758,933 | 5/1930 | Chapman . |
| 2,043,416 | 6/1936 | Lueg . |
| 2,793,324 | 5/1957 | Halus et al. . |
| 3,185,778 | 5/1965 | Giannini et al. ........................ 381/167 |
| 3,476,887 | 11/1969 | Seligson et al. . |
| 4,025,724 | 5/1977 | Davidson, Jr. et al. .................. 381/71 |
| 4,480,333 | 10/1984 | Ross ........................................ 381/71 |
| 4,811,404 | 3/1989 | Vilmur et al. . |
| 5,146,505 | 9/1992 | Pfaff et al. . |

OTHER PUBLICATIONS

Joseph, James "Flame Amplification", *Popular Electronics*, May 1968, pp. 47–53.
Eriksson, L. J. "Recursive Algorithms for Active Noise Control", Apr. 1991, pp. 137–146.
Active Noise Control Systems, IEE Proceedings, vol. 134, Pt. A, No. 6, Jun. 1987, R. R. Leitch, M. O. Tokhi, pp. 525–546.
Acoustics and Gas Discharge: Applications to Loudspeakers F. Bastein, 1987 IOP Publishing Ltd; pp. 1547–1557.
Sound Generation by Means of a Modulated Electrical Discharge Localized in the Combustion Zone, 1985 Plenum Publishing Corp, pp. 292–296.
Companies Profit From Sounds of Silence, Francesca Lunzer, April 1988/High Technology Business; pp. 39–42.
Musical Flames, Nature vol. 216, Nov. 18, 1967, pp. 676–678.
*Electric Field Control of Oscillatory Flames*, Combusion & Flame, 15, 85–88 (1970), The Combustion Institute.

*Primary Examiner*—Curtis Kuntz
*Assistant Examiner*—Ping W. Lee
*Attorney, Agent, or Firm*—Mathews, Woodbridge & Collins

[57] ABSTRACT

A system for suppressing sound from a flame comprises a detector for detecting a first signal which emanates from the flame. A photo sensor rapidly detects the noise from the flame. The first signal is inverted to produce a second signal. The second signal is applied to the flame for cancelling the sound produced by the flame. Preferably, an electric arc is produced between a cathode positioned in the flame and an anode positioned around the flame. The electric arc is modulated by the second signal.

14 Claims, 3 Drawing Sheets

SYSTEM FOR SUPPRESSING SOUND FROM A FLAME

BACKGROUND OF THE INVENTION

1. Field of the Invention

This invention relates to a method and system for expeditiously reducing noise from a flame.

2. Description of the Related Art

Unwanted acoustic sound has negative effects on humans and animals. Some of the negative effects of unwanted noise include damage to hearing, creating an inefficient work environment and inducing dangerous vibrations in buildings. Conventional methods for reducing the sound intensity of noise include passive and active noise control.

Prior art passive noise control systems include using sound absorbent materials around the source of the noise. The use of sound absorbent material has the disadvantage that the material is expensive and the material is ineffective for lower frequencies. In addition, passive noise control systems are not suitable for a flame environment.

Conventional active noise control systems attenuate undesirable noise in the form of acoustic waves by producing and superimposing noise canceling waves which are substantially equal in amplitude and frequency content, but shifted 180 degrees in phase with respect to the noise. A speaker produces the canceling waves or vibrations.

U.S. Pat No. 2,043,416 describes an active control system for silencing sound oscillations of sound waves travelling through the air. A microphone receives a sound wave travelling through the air in one direction. An amplifier connected to the microphone produces sound waves having opposite phase in relation to the received sound wave. The opposite phase sound waves travel in the same direction as the received sound waves to cause mutual elimination of the two sound waves.

U.S. Pat. No. 5,146,505 describes a method for actively attenuating engine generated noise. A signal is adaptively filtered to produce a canceling waveform which is superimposed with the engine noise to attenuate selected multiple harmonic noise components. The canceling waveform drives a speaker to generate canceling acoustic waves for superposition with the engine induction noise.

It is known that noise is produced by combustion gases in a high intensity flame. However, the inventor is unaware of any systems for accurately and quickly reducing noise produced from a flame.

SUMMARY OF THE INVENTION

Briefly described the present invention comprises a system for suppressing sound produced by a flame. A first acoustical signal is detected from the flame. The first acoustical signal represents the modulation of the flame. A second acoustical signal is produced which is inverted in relation to the first acoustical signal. The second acoustical signal is applied to the flame to suppress the sound produced by the flame.

Preferably, an electric arc is produced between a cathode and an anode for applying the second signal to the flame. In a first embodiment, the cathode is placed in the flame and an anode is placed around the flame. In a second embodiment, the anode is placed in the flame and the cathode is placed around the flame. The distance between the cathode and anode can be "altered" to vary the length of the electric arc. The longer the electric arc the greater the sound suppression.

A photo sensor can be used for detecting the first acoustical signal. The photo sensor operates at the speed of light for rapidly detecting the sound produced by the flame.

The invention will be further understood by reference to the following drawings.

DETAILED DESCRIPTION OF THE INVENTION

During the course of this description, like numbers will be used to identify like elements according to the different views that illustrate the invention.

Figure 1:
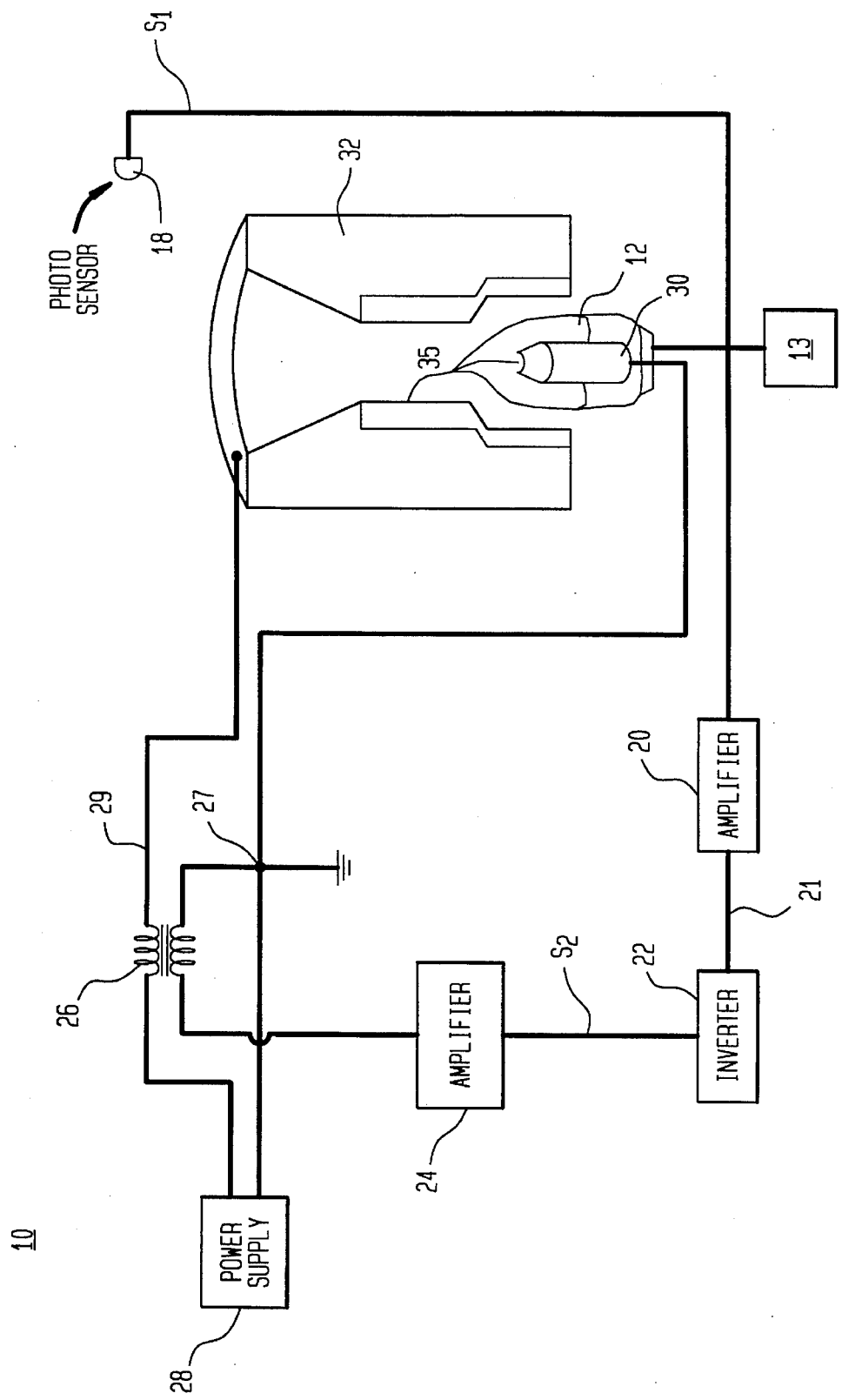
FIG. 1 is a schematic view of the system for suppressing sound produced by a flame in accordance with the teachings of the present invention.

FIG. 1 is a schematic view of a system for reducing sound produced by a flame 12 in accordance with the teachings of the present invention. Flame 12 is typically produced by a fuel source 13. For example, flame 12 can be produced by a welding torch fueled by acetylene and oxygen. Preferably, flame 12 is produced by high velocity gases in order to produce a flame with high intensity. Flame 12 can be used in a jet propulsion engine, a hot air balloon, a gas furnace, a gas range and a welding torch. In addition, flame 12 can be used in an oil burner. An oil burner typically produces a yellow flame. Recycled unspent carbon gases from the flame of the oil burner can be used to increase the intensity of the flame and to produce a blue flame. The blue flame produces a loud sound.

Photo sensor 18 detects fluctuation in light emitted from flame 12. Photo sensor 18 detects light emitted from flame 12 at the speed of light. The rate of fluctuation of flame 12 is in the audio range and produces a modulation of the sound produced from flame 12. The rate of fluctuation can be in the range of 20 hertz to 20,000 hertz. Photo sensor 18 expeditiously produces a signal $S_1$ having the modulation of flame 12. The louder the sound the greater the suppression of the sound. The sound can be suppressed up to 25 db. Preferably, the sound is suppressed so that no sound is emitted from flame 12.

Other acoustical wave sensor devices can be used to detect fluctuation in light emitted from flame 12. For example, an acoustic transducer, a microphone or a pressure sensitive device could be used to detect light emitted from flame 12. However, the acoustical wave sensor devices may have the disadvantage of operating at a slower speed than photo sensor 18.

Amplifier 20 amplifies receiver signal $S_1$. Preferably, amplifier 20 adjusts the gain of signal $S_1$ from 1 to 50. Output 21 from amplifier 20 is applied to inverter 22. Inverter 22 inverts signal $S_1$ to produce signal $S_2$. Signal $S_2$ has the same amplitude and frequency as signal $S_1$ and is 180° out of phase of signal $S_1$ for cancelling the sound produced by flame 12. Amplifier 24 amplifies signal $S_2$.

Audio output transformer 26 is used to couple power supply 28 to amplifier 24, cathode 30 and anode 32. Preferably, transformer 26 is an audio output transformer used in "reverse" to step up secondary windings to the higher voltage. Power supply 28 is connected through primary windings to cathode 30 and anode 32. Lead 27 connects transformer 26 to cathode 30 and lead 29 connects transformer 26 to anode 32. Current can be applied between less than 1 amperes and 80 kiloamperes to produce electric arc 35.

Cathode 30 is positioned adjacent or in flame 12. Preferably, cathode 30 is placed in flame 12. Anode 32 surrounds flame 12. Current is applied to cathode 30 which is modulated by signal $S_2$. An electric arc 35 is produced between cathode 30 and anode 32 which inversely modulates sound produced by flame 12. Preferably, cathode 30 and anode 32 are formed from tungsten.

The distance between cathode 30 and anode 32 can be adjusted to vary the length of electrical arc 35. It has been found that a longer electric arc 35 can suppress a louder sound. Longer wavelength lower frequencies require a longer arc and, therefore, a longer distance is needed between cathode 30 and anode 32. Preferably, electric arc 35 is between 8 mm and 15 m long.

Figure 2:
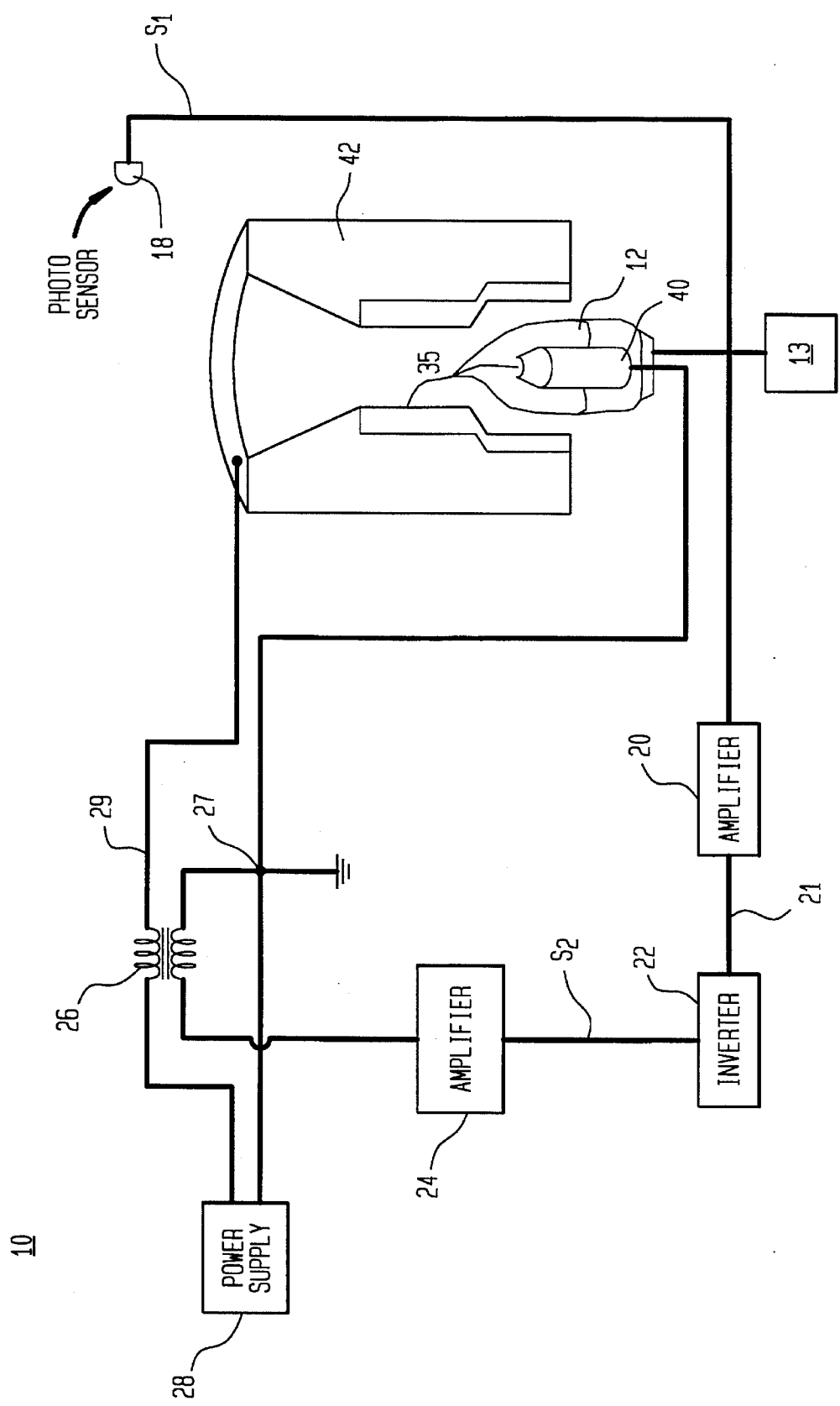
FIG. 2 is a schematic view of the system of the present invention in an alternative embodiment.

In this embodiment, current flows from cathode 30 to anode 32 in the direction of flame 12 for canceling out the sound produced by flame 12. In an alternative embodiment, anode 40 is positioned adjacent or in flame 12 and cathode 42 surrounds flame 12, as shown in FIG. 2. In this embodiment current flows in the opposite direction of flame 12.

Sound is produced by ionization of ions in flame 12 and by windshear of the high velocity gas in flame 12 as it passes through surrounding stationary air. Flame 12 produces ions which flow between cathode 30 and anode 32. Ionization of flame 12 can be improved by supplying a wick feeding alkaline earth metals such as cesium, rubidium, potassium, and sodium as carbonates in solution to flame 12 for increasing ionization and thereby allowing more current to flow between cathode 30 and anode 32. Electric arc 35 impresses a voltage between cathode 30 and anode 32 through the flow of ions. Modulation by signal $S_2$ for current supplied by cathode 30 produces either a positive flow of ions from cathode 30 to anode 32 or little or no flow of ions between cathode 30 and anode 32.

Figure 3:
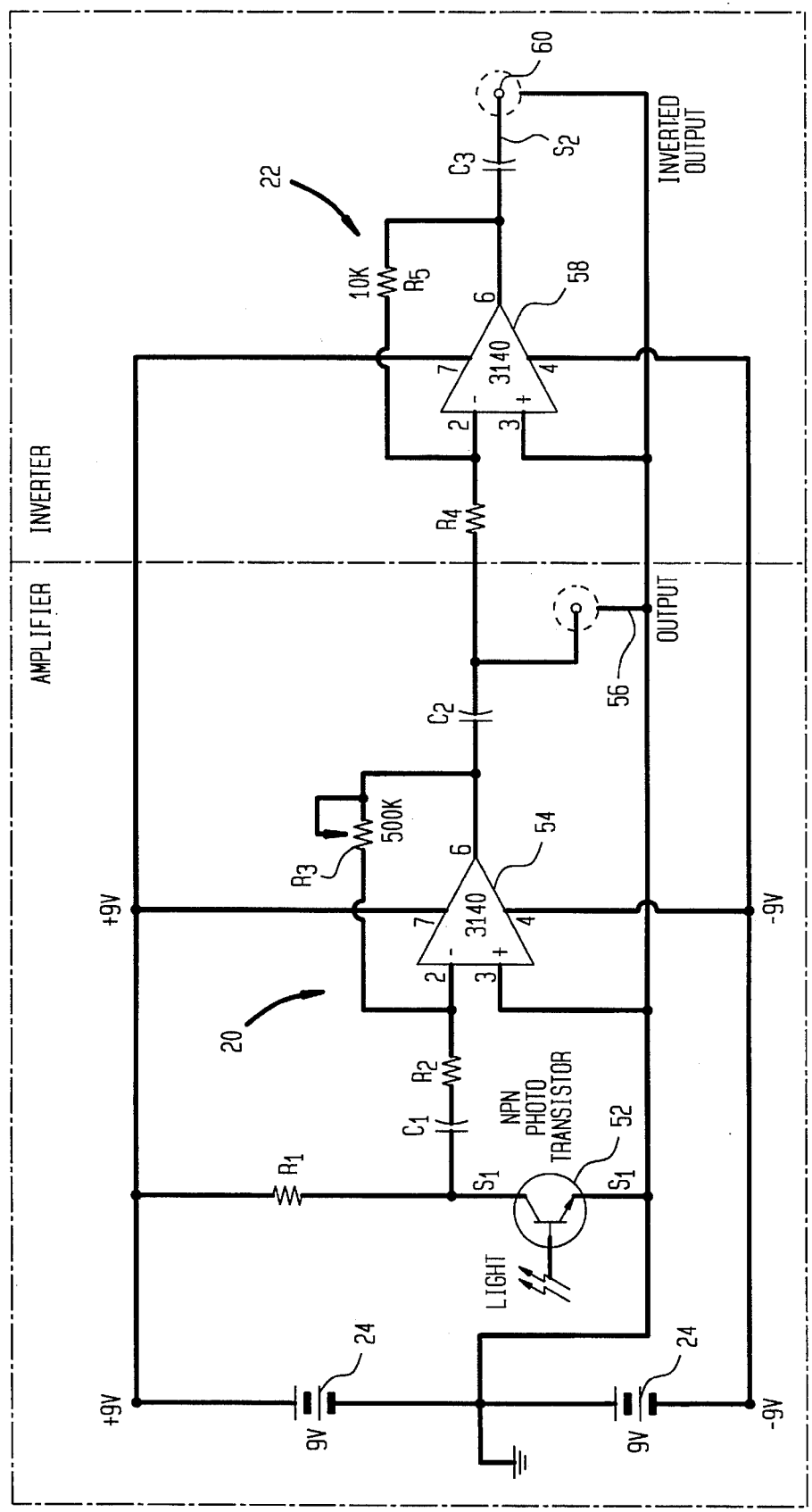
FIG. 3 is a circuit diagram of an amplifier and inverter used in the present invention shown in FIGS. 1 and 2.

FIG. 3 is a schematic diagram of an amplifier 20 and inverter 22 which can be used in the present invention. Photo detector 18 includes a npn transistor 52 for producing signal $S_1$ from the light detected from flame 12. Operational amplifier 54 adjusts the gain. Preferably, the gain is adjusted from 1 to 50. Operational amplifier 58 inverts signal $S_1$ to produce signal $S_2$.

The major elements which comprise the electronics of the invention are set forth in the Parts List below.

| Parts | Description | Designation |
|---|---|---|
| Board | P.C. Board | $B_1$ |
| Res. | 10 K 10% | $R_1, R_2, R_4, R_5$ |
| Res. | 500 K 10% | $R_3$ |
| CAP | 0.1 UFD | $C_1$–$C_3$ |
| Photo-sensor | Motorola MRD-810, MRD-3050 | 52 |
| Op Amp | 3140 | 54, 58 |
| Audio Transformer | 24S77 | 26 |

It will be appreciated that digital processing techniques known in the art can be used for producing signal $S_1$ and signal $S_2$ which is out of phase by 180° from signal $S_1$.

The present invention provides the advantage of expeditiously detecting and suppressing sound from a flame. Detection of the sound is performed at the speed of light. An electric arc modulates the flame to produce a signal 180° out of phase for canceling the sound produced by the flame. The present invention does not use a speaker for applying the waveform, which system may not be as accurate or fast as the system of the present invention.

While the invention has been described with reference to the preferred embodiment thereof, it will be appreciated by those of ordinary skill in the art that modifications can be made to the structure and functions of the system without departing from the spirit and scope of the invention as a whole.

I claim:

1. A system for suppressing sound produced by a flame comprising:

a photo sensor for detecting fluctuation of said flame for producing a first acoustical signal from said flame, said first acoustical signal having a rate of fluctuation in the range of 20 to 20,000 hertz;

means for producing a second acoustical signal which is inverted in relation to said first acoustical signal; and an electric arc for applying said second acoustical signal to said flame, said electric arc is modulated by said second acoustical signal to cause a suppression of said sound produced by said flame.

2. The system of claim 1 further comprising:

a cathode; and an anode;

wherein said electric arc is produced between said cathode and said anode.

3. The system of claim 2 wherein said means for producing a second acoustical signal further comprises:

an amplifier for amplifying said detected first acoustical signal; and an inverter for inverting said first acoustical signal into said second acoustical signal.

4. The system of claim 3 wherein said flame is formed of high velocity gas.

5. The system of claim 4 wherein said photo senor is a NPN transistor.

6. The system of claim 5 wherein said cathode is placed in said flame and said anode is placed around said flame, said electrical arc flows in the direction of said flame.

7. The system of claim 5 wherein said anode is placed in said flame and said cathode is placed around said flame and said electrical arc flows in the direction opposite of the direction of said flame.

8. The system of claim 1 wherein said flame is produced by a jet propulsion engine.

9. The system of claim 1 wherein said flame is produced by a welding torch.

10. The system of claim 1 wherein said flame is produced by an oil burner.

11. The system of claim 1 wherein said flame is produced by a gas furnace.

12. The system of claim 1 wherein said flame is produced by a hot air balloon.

13. A method for suppressing sound produced by a flame comprising the steps of:

detecting a first acoustical signal from said flame with a photo sensor, said first acoustical signal having a rate of fluctuation in the range of 20 to 20,000 hertz;

producing a second acoustical signal which is inverted in relation to said first acoustical signal; and applying said second acoustical signal to said flame between a cathode and an anode to produce an electric arc which is modulated by said second acoustical signal to cause a reduction of said sound produced by said flame.

14. The method of claim 13 further comprising the step of:

amplifying said detected first acoustical signal.

* * * * *